United States Patent [19]
Robinson et al.

[11] 4,426,675
[45] Jan. 17, 1984

[54] CARRIER FOR CIRCUIT BOARDS

[75] Inventors: Anthony H. J. Robinson; Erno Peter, both of London, Canada

[73] Assignee: Northern Telecom Limited, Montreal, Canada

[21] Appl. No.: 365,443

[22] Filed: Apr. 5, 1982

[51] Int. Cl.³ .............................................. H05K 1/14
[52] U.S. Cl. .................................. 361/415; 206/328; 206/509; 206/518; 361/212
[58] Field of Search ................ 361/415; 206/334, 328, 206/329, 509, 513; 220/72, 22.3

[56]  References Cited
U.S. PATENT DOCUMENTS

| | | | |
|---|---|---|---|
| 929,022 | 7/1909 | Ross | 206/509 |
| 2,634,020 | 4/1953 | Bartholomew | 206/518 X |
| 3,001,102 | 9/1961 | Stiefel et al. | 361/415 X |
| 3,026,453 | 3/1962 | Marks | 361/415 |
| 3,231,785 | 1/1966 | Calabro | 361/415 X |
| 3,915,307 | 10/1975 | Agarde | 361/415 X |
| 4,099,623 | 7/1978 | Osdol | 361/415 X |
| 4,261,465 | 4/1981 | Thomas | 220/22.3 X |
| 4,277,120 | 7/1981 | Drake | 361/415 X |

FOREIGN PATENT DOCUMENTS 2023102  5/1979  United Kingdom ................ 206/328

OTHER PUBLICATIONS

Vero Electronics Inc., Vero Systemized Products Catalog N.Y. cover page, Minnesota Mining & Mnfg. Co., Veldstat Catalog, 7/79, Conductive Toto Boxes.

Primary Examiner—R. R. Kucia
Attorney, Agent, or Firm—Sidney T. Jelly

[57]  ABSTRACT

A carrier for circuit boards comprises an open top box and a frame in the box. The frame is formed of four members—two sides and two ends which can be assembled to give predetermined variable spacing between the sides. Channel members clip to the inner surfaces of the sides. Box and frame are of metal, and the channel members can be of electrically conductive plastic. Metal lids can be provided. Boards are protected against static discharge damage and against dust and dirt. The top edge of the box has a rim into which the bottom of another box fits, for stacking. Electrically conductive foam material is placed on the bottom and at the sides to provide shock absorption.

11 Claims, 14 Drawing Figures

CARRIER FOR CIRCUIT BOARDS

This invention relates to a carrier for circuit boards and is particularly concerned with a carrier which holds circuit boards during transit, and in storage, safely and which avoids damage to electronic components on the boards due to static.

Circuit boards are made in a variety of sizes, and shapes, although basically they are of rectangular plan form. The boards are processed through a variety of steps, from the production of a circuit pattern on one, or both sides; mounting of some components, such as by automatic insertion; mounting of other components by hand; wave soldering or vapour soldering; and eventually, in many cases, assembled with other parts, to form final assembly or to form a sub-assembly for further assembly into apparatus.

A typical variety of circuit boards are those used in telecommunications. Small circuit boards are used in association with the dial. Larger boards are used in the so-called speakerphones and in repertory dialers. Still larger boards are used in terminals, which may have video displays, as well as voice transmission and reception. The boards are usually rectangular, and vary from square boards to relatively long, narrow boards.

The boards usually proceed along an assembly line structure, and at various stages may be held in storage for some time. In many examples, boards are held in open carriers, and dirt and dust can reach the boards. Sometimes boards are just piled in bins, with possible damage to components. The carriers, and/or bins, vary in size and are difficult to stack. At various times during processing, boards are handled by operators. Unless operators take care to electrically ground themselves it is possible that quite a high static charge exists between operator and ground. On handling a board this static can discharge through the board with consequential damage to components.

The present invention provides a carrier for circuit boards which is adjustable for size, protects the boards, is readily stacked, and provides protection from damage by static discharge. The carrier is particularly suitable for automated storage and processing. Broadly, the carriers of the present invention comprises an open box-like frame having sides and ends, the sides adjustable in spacing, with grooved members attached to the sides for reception of boards. The frame fits in a box, which can be provided with one or more lid members. In addition to the sides having adjustable spacing, additional members can be positioned between the sides, for small boards. The frame and box are of metal, typically aluminum, which assists in avoiding static damage to components. The box is preferably formed, at top and bottom edges, to facilitate stacking.

The invention will be readily understood from the following description in conjunction with the accompanying drawings, in which.

Figure 2:
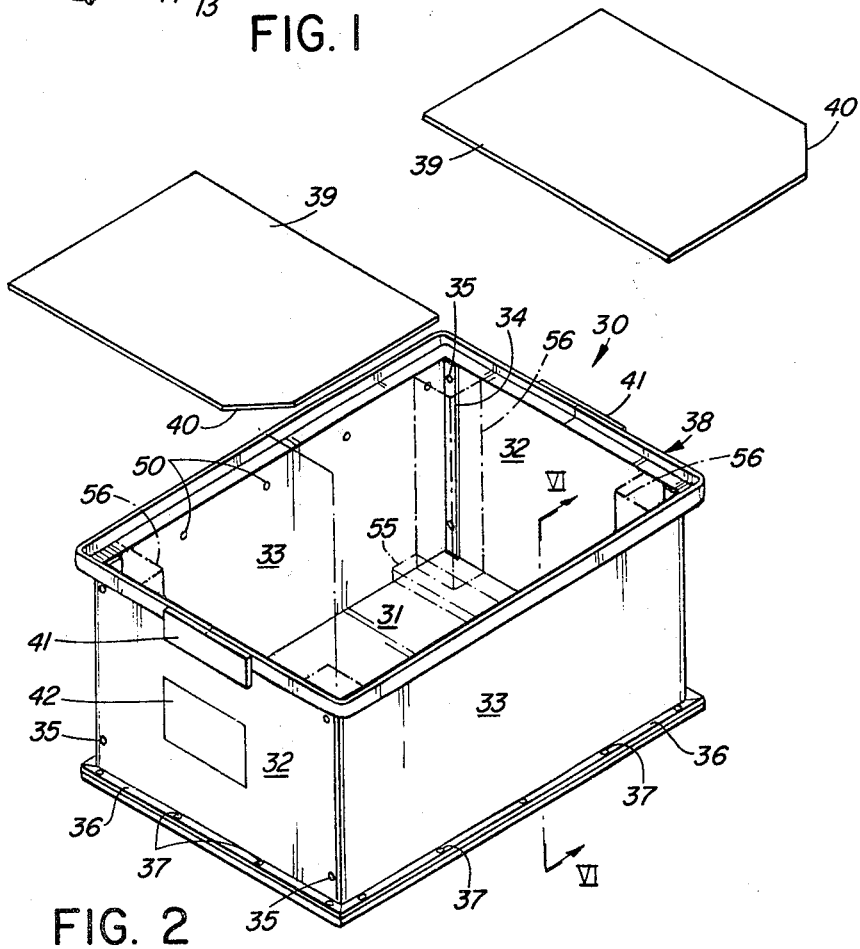
FIG. 2 is a perspective view of one form of box.
Figure 6:
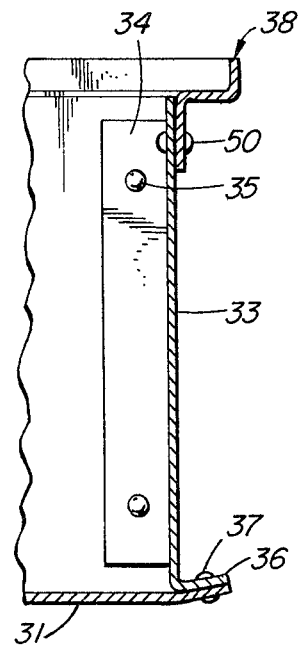
Figure 7:
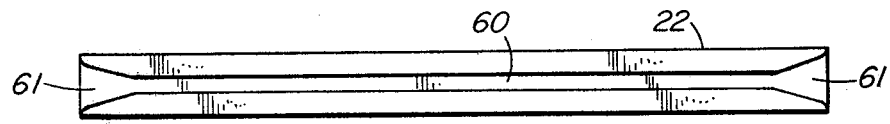
Figure 8:
Figure 9:

FIGS. 5(a) to (d) illustrate diagrammatically alternative assemblies of frames;

FIG. 6 is a cross-section on the line VI—VI of FIG. 2;

FIGS. 7, 8 and 9 are plan view, side view and end view respectively of one form of channel member.

Figure 1:
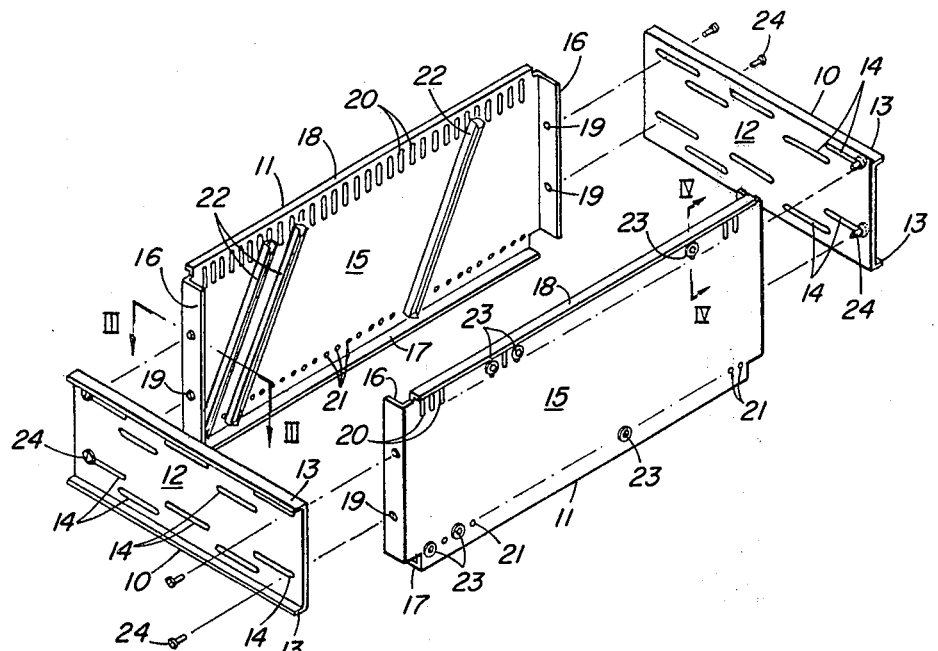
FIG. 1 is an exploded perspective view of one form of frame.

FIG. 1 illustrates one form of frame, having two ends 10 and two sides 11. For cost reduction purposes, ends 10 are the same and sides 11 are the same merely being reversed on assembly. Each end 10 is of shallow channel cross-section having a main web portion 12 and shallow flanges 13 along each edge. A series of elongate slots 14 are formed in the web portion 12. The slots are arranged to form four pairs, two pairs toward each end, and with the slots of one pair offset laterally and overlapping the slots of the other pair, at each end. The flanges 13 provide stiffness and the ends are readily manufactured by stamping.

Each side 11 has a main web portion 15 and inturned ends 16. One edge 17 is turned inward while the other edge 18 is turned outward. In each inturned end 16 are two apertures 19. The spacing of the apertures is the same as that of a pair of slots 14. Conveniently the apertures 19 are formed by piercing and swaging to create an increase in thickness around each aperture, which is then threaded for reception of screw 24. The swaging also engages in slot (see FIG. 3), and acts as a guide or locating member.

Figure 4:
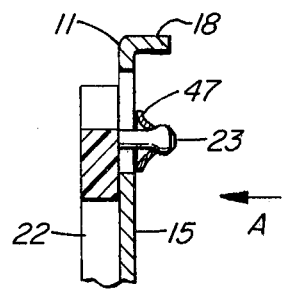
FIG. 4 is a cross-section on the line IV—IV of FIG. 1, with detact of a protrusion, FIGS. 4(a) and 4(b) being views in the direction of arrow A in FIG. 4, illustrating two alternative connection arrangements with the protrusions.

Formed along the main web portion 15 close to outturned edge 18 are a plurality of parallel slots 20. Adjacent to the in-turned edge 17 are circular holes 21. Channel members 22 are attached to the sides 11 by snapping protrusions 23 on the members 22 through slots 20 and holes 21. This is illustrated in FIG. 4. The channel members can be inclined, as shown, at any convenient angle, or vertical. Wider boards can be accommodated with the channel members inclined.

The ends 10 are assembled to the sides 11 and adjusted in spacing to give the desired dimension between members 22 necessary to hold circuit boards. The sides 11 can be assembled to the outermost pair of slots at each end, or to the innermost pair at each end. The position along the slots can also be varied. It is also possible to assemble a side 11 in the outermost pairs of slots, at or towards the outermost ends of the slots and further sides then assembled to the innermost pairs of slots. This provides two sets of supports for boards. For very small boards, two more sides can be assembled back to back with the further sides, providing a further set of supports. FIGS. 5(a) to (d) illustrate diagrammatically different arrangements.

Thus one frame can hold a single stack of circuit boards, two stacks, or for very small boards, three stacks. Further, if components are only mounted on one side of the boards and do not project very far from the board surface, two boards can often be held in one pair of channel members 22, in a back-to-back arrangement.

FIG. 2 illustrates a box or container 30 in which a frame is held. In the example, the box is formed from a base 31, two ends 32 and two sides 33. At each end the sides have flanges 34 which overlap the ends 33, the sides and ends being rivetted together, as indicated at 35. The lower edges of ends and sides are bent outward to form narrow flanges 36. The base 31 extends out to the edges of the flanges 36 and is rivetted thereto, as illustrated at 37. A rim 38 extends around the top of the box, having an outwardly extending portion and an upwardly extending wall. The overall dimensions of the rim 38 are such that a base of a box can sit in the rim for stacking. The structure of rim, and base attachment are illustrated in FIG. 6. The rim is useful for lifting boxes, as well as convenient for stacking.

The box can be closed by a lid, in the present example formed from two sheets of metal 39 which meet at the center. Conveniently a corner is removed from each sheet, at 40, for use in removal. The lids are not necessary during stacking, but during travel between process steps or in short time storage in individual storage bays, lids keep out dirt. Also, with metal lids in position, a person wanting to remove a circuit board must lift and slide one of the lids across and in doing so discharges any static which may have built up, before a board is handled. With the two sheets meeting at the center, they will not ride over each other if the box is tilted. The two sheets can be slightly shorter in total length than the length of the box. Alternatively, the two sheets could be hingedly attached. Handles 41 can be provided at each end of a box, for removal from racks.

Figure 3:
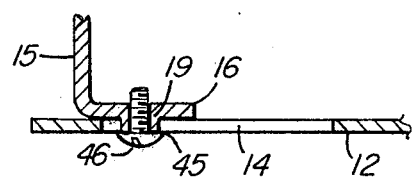
FIG. 3 is a cross-section on the line III—III of FIG. 1.

FIG. 3 illustrates the swaging of the material of the ends 16, around the apertures 19. The swaging, indicated at 45, is of a diameter which is a close sliding fit in an elongate slot 14. This acts both as an assembly guide or locating feature and also provides a sufficient thickness of material that the apertures 19 can be internally threaded, to receive screws 46. As an alternative, bolts and nuts can be used to assemble ends 10 and sides 11.

Figure 4A:
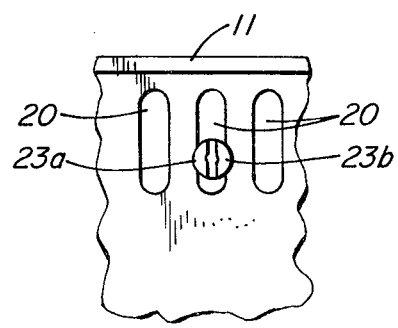
Figure 4B:
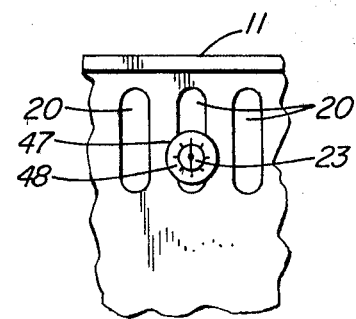

FIG. 4 illustrates one way of attaching the channel members 22. At each end of a channel member is a protrusion 23, extending from a back surface. The protrusion is split into two portions along a line coincident with the longitudinal axis of the channel member. The protrusions have an enlarged head portion which is slightly larger in diameter than the width of slots 20 and the diameter of the holes 21. When a channel member is assembled to side 11, the protrusions 23 snap through the slots 20 and holes 21 by deflection of the two portions. The two portions are seen more clearly in FIG. 4(a), the portions indicated at 23a and 23b. While this snap action is usually sufficient to retain the channel members in position, a more permanent assembly can be obtained by pushing a spring clip over the protrusions. This is illustrated in FIG. 4(b), the clip indicated at 47. The clip has radial legs 48 which deflect in passing over the enlarged head portion of a protrusion and then engage behind the head portion. Without clip 47 the portions 23a and 23b of the protrusions 23 spring apart after snapping through the slot 20 and holes 21, but with a clip 47, the portions 23a and 23b are held together by the clip. In an alternative arrangement, the edges of the slots 20 can be bent outward to form edges which engage behind the protrusions 23. The length of the rack portion of the protrusion affects the effectiveness of the snap-in action. A short neck can obviate use of a clip as at 47, or forming of the edges of the slots 20.

Figure 5A:
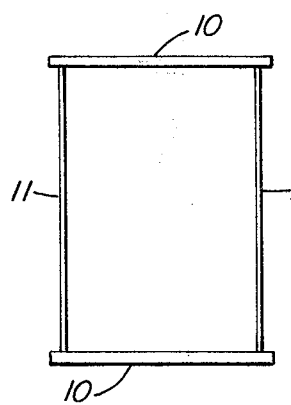
Figure 5B:
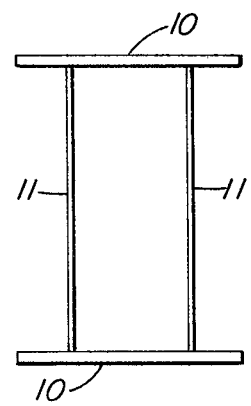
Figure 5C:
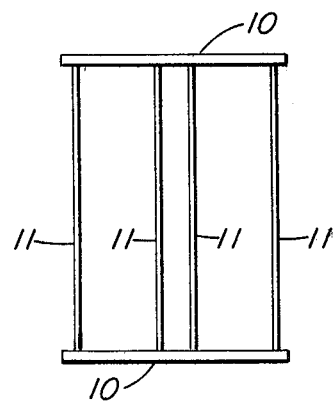
Figure 5D:
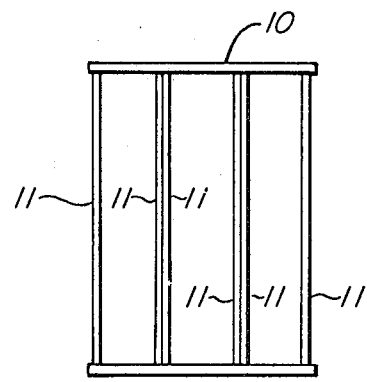

FIGS. 5(a), (b), (c) and (d) illustrate, very diagrammatically four alternative arrangements for a frame. In FIG. 5(a) two sides 11 are assembled to ends 10, at the outer ends of the outer pairs of slots 14. In FIG. 5(b) two sides 11 are assembled at the inner ends of the outer pairs of slots 14, although a similar positioning can be obtained by assembling the sides to the outer ends of the inner pairs of slots 14. In FIG. 5(c), two sides 11 are assembled to the ends 10 at the outer ends of the outer pairs of slots 14, and two further sides 11 are assembled to the ends 10 at the inner ends of the inner pairs of slots 14. This latter arrangement gives storage for two rows of boards. In FIG. 5(d), with two sides assembled at the outer ends of the outer pairs of slots 14 four further sides are assembled in back-to-back pairs. These back-to-back pairs of sides can be assembled at the inner ends of the outer pairs of slot 14 or at the outer ends of the inner pairs of slots 14. This gives storage for three rows of boards. The particular positioning, and spacing, can be varied from that illustrated, to suit requirements. Although the inner pairs of slots 14 are offset slightly from the outer pairs, the slight misalignment resulting from one side being in an outer pair of slots 14 and the associated side being in an inner pair of slots 14 is not critical as the channel in the members 22 is wide enough to accept slight variations in alignment and similar effects. When narrow boards are being stored, that is boards which are much narrower than the height of a box distance or spacer members can be placed in the box between the sides of a frame, to keep the boards up near the top of a box.

FIG. 6 illustrates the attachment of the base 31 to the sides and ends. In FIG. 6, the attachment of base to a side 33 is shown but is similar for the ends 32 also. The bottom edge flanges 35, and the peripheral edges of the base 31 are inclined upward at a small angle. This provides some clearance for the lower heads of the rivets 37. When the boxes are travelling along a roller conveyer, the clearance prevents jolting as the rivet heads pass over the rollers. While not an essential feature, it is easily provided and reduces vibration of the circuit boards. The rim 38 is also illustrated in FIG. 6, being rivetted to the top edge of the side 33, by rivets 50. The rim is similarly attached to the ends 32. However, it is feasible that spot welding be used, instead of rivets, if desired.

FIGS. 6, 7 and 8 illustrate one form of channel member 22. A member is of rectangular cross-section with a channel 60 extending the length of the member. At each end the channel is tapered outwardly, at 61, to give a tapered lead-in formation for ease in inserting boards. From the back surface extends the protrusions 23. The channel 22 is wider than the thickness of a board, to permit some misalignment, and in some cases will accept two boards back-to-back. By making the channel members of electrically conductive material, a further protective step is provided, against static discharge damage.

To further reduce vibration of the boards, resilient foam material can be attached to the interior of the box. Thus, for example, strips of foam material can extend across the base of the box, as indicated in dotted outline at 55 in FIG. 2. Further foam material can be attached to the sides, for example at the corners, as indicated in dotted outline at 56 in FIG. 2. The foam material is preferably of conductive material and thus provides a grounding of the circuit boards. Also, after the frames have been inserted in boxes, extra pieces of foam material can be inserted between the web portions 15 and the sides 33.

The frames and boxes provide a carrier for circuit boards with many advantages. Thus, as stated, electrostatic discharge damage can be accommodated. The carriers are rugged yet quite light, giving ease of stacking. The parts are readily manufactured by simple press tools. The carriers are excellent for use on automated production lines where carriers are moved along conveyers, being deflected off, and back on, by deflector arms and other mechanisms remotely controlled. The carriers are very acceptable to carousal storage systems, in which carriers are stored, usually for relatively short periods, in discrete enclosures in system which rotates. The insertion of carriers into enclosures and removal from enclosures can be automated, and in a completely automated system, the carriers are coded and their position in the carousal entered in the memory of a control computer. Carousal storage is usually intended for storage between process or assembly steps.

Carriers have previously been made of various materials, for example plastic and metal. The plastic form of construction is quite heavy. Also, when made of metal, heavy construction is used. In many cases, instead of insertion of boards from the top, they are inserted from the side, with the result that boards can be readily dislodged from the carrier when deflected in a carousal or on a conveyor. Boards can fall out as a result of tilting when a carrier is picked up. The carriers are also open to dirt and dust.

In the carriers of the present invention, the whole structure is preferably of the same material, typically aluminum. This avoids corrosion problems, particularly galvanic action. All parts are made, preferably, from the same thickness of stock, for economy. Thus as an example, aluminum sheet 0.040" thick is a typical material. The carriers are used "as is", that is no plating or painting or other finishing is required. A carrier is quite light—a box and frame with lid, is as light as, or lighter than just the box when in plastic.

Coding, or identification of a carrier is readily provided by cards inserted into adhesive backed plastic envelopes applied to the ends, and sides if desired, of the box. Thus, a plastic envelope is attached at an end 32, as indicated at 42 in FIG. 2. A card is inserted in the envelope, which is transparent, and can be "read" by a scanner. A bar code can be applied to the card before insertion. Envelopes can readily be replaced when damaged.

While the invention has been described in connection with the carrying, and storing, of circuit boards, it will be apparent that a carrier, as described, can also be used for carrying, and storing other relatively flat articles which require protection.

What is claimed is:

1. A carrier for circuit boards, comprising:-
   a rectangular metal box having a bottom, sides and ends extending up from said bottom and an open top;
   a removable metal frame positioned in said box, said frame comprising two parallel spaced apart sides and two parallel spaced apart ends;
   each of said ends comprising an elongate web portion and a plurality of pairs of elongate slots at each end of said web portion, the spacing of the slots in each pair being the same for all pairs, said slots extending in a direction corresponding to the spacing of said sides, the pairs of slots at an end being offset relative to each other and in overlapping relationship;
   each of said sides comprising a web portion and an inturned edge at each end of the web portion extending normal to the web portion; locating means on each inturned edge comprising two swaged formations spaced apart a distance equal to said spacing of the slots in a pair, the swaged formations positioned in selected ones of said pairs of slots; locking means on each inturned edge, said locking means comprising threaded holes in said swaged formations and screws in said threaded holes engaging with said ends to lock said sides and ends together;
   a row of apertures along a top edge of said web portions of each side and a row of apertures along a bottom edge of said web portions of each side, the apertures comprising circular holes along one of said top and bottom edges and slots along the other of said top and bottom edges, the slots extending normal to the edge;
   a plurality of channel members removably attached to an inner surface of each of said web portions of said sides, each channel member having a deformable protrusion at each end, the protrusion snapped into said apertures in said sides and being removeable from said apertures.

2. A carrier as claimed in claim 1, including a rim extending around a top edge of said box, said rim including an outwardly extending portion, extending from said sides and ends, and an upwardly extending wall at the periphery of the outwardly extending portion.

3. A carrier as claimed in claim 2, including an outwardly extending flange at a bottom edge of each of said sides and ends, said bottom attached to said sides and ends at the flanges.

4. A carrier as claimed in claim 3, said outwardly extending flanges being dimensioned to fit in said rim, said flanges resting on said outwardly extending portion of said rim.

5. A carrier as claimed in claim 2, including a lid resting in said rim.

6. A carrier as claimed in claim 5, said lid comprising two flat sheet-like members, side-by-side in said rim.

7. A carrier as claimed in claim 1, including resilient foam material extending across said bottom, inside said box.

8. A carrier as claimed in claim 7, including resilient foam material attached to the sides of said box.

9. A carrier as claimed in claim 8, said resilient foam material being electrically conducting.

10. A carrier as claimed in claim 1, said channel members being of electrically conducting plastic.

11. A carrier as claimed in claim 1, including means for attaching identifying means to said box.

* * * * *